(12) United States Patent
Chang

(10) Patent No.: US 6,695,045 B2
(45) Date of Patent: Feb. 24, 2004

(54) BLADED HEAT SINK

(75) Inventor: Juei-Chi Chang, Taipei (TW)

(73) Assignee: Mitac Technology Corporation, Hsinchu (TW)

( * ) Notice: Subject to any disclaimer, the term of this patent is extended or adjusted under 35 U.S.C. 154(b) by 0 days.

(21) Appl. No.: 10/100,767

(22) Filed: Mar. 19, 2002

(65) Prior Publication Data

US 2003/0178180 A1 Sep. 25, 2003

(51) Int. Cl.[7] ................................................ H05K 7/20
(52) U.S. Cl. ...................... 165/185; 165/80.3; 165/122; 174/16.3; 257/722; 361/697; 361/704
(58) Field of Search ............... 165/80.3, 122, 165/185; 174/16.3; 257/722; 361/697, 704

(56) References Cited

U.S. PATENT DOCUMENTS 3,240,263 A * 3/1966 Stewart ...................... 165/80.3
4,611,238 A * 9/1986 Lewis et al. ................. 257/722
5,229,914 A * 7/1993 Bailey ......................... 165/80.3
5,299,090 A * 3/1994 Brady et al. ................ 165/80.3
5,583,746 A * 12/1996 Wang .......................... 361/697
6,196,298 B1 * 3/2001 Shaw .......................... 165/80.3
6,360,816 B1 * 3/2002 Wagner ....................... 165/122

FOREIGN PATENT DOCUMENTS

DE         3151838 A1  *  7/1983  ................ 257/722
EP          246432 A2  * 11/1987  ................. 74/16.3

* cited by examiner

Primary Examiner—Leonard R Leo
(74) Attorney, Agent, or Firm—Merchant & Gould P.C.

(57) ABSTRACT

A bladed heat sink. The sink includes a connecting board, a plurality of blades, a frame and at least one reinforcing rib. The connecting board is enclosed by the frame. The blades radiate from the connecting board to the frame. Furthermore, the blades are disposed in layers and spaced apart, thereby allowing an airflow to pass between the blades. The blades are also reinforced by the reinforcing rib.

3 Claims, 3 Drawing Sheets

BLADED HEAT SINK

BACKGROUND OF THE INVENTION

1. Field of the Invention

The present invention relates in general to an effective, quiet and thin bladed heat sink.

2. Description of the Related Art

Due to ever-increasing workloads placed on modern-day computers, combined with higher operating speeds, heat generated by central processing units (CPUs) in computers often reaches extreme levels. As well, the ventilation of the inside of computers is poor so that environmental temperatures of CPUs in operation run high. To avoid failure of CPUs due to overheating, a variety of heat sinks for cooling CPUs have been developed.

Referring to FIG. 1, reference numerals 10 and 30 represent a fan and a central processing unit (CPU), respectively. A conventional heat sink 20 generally is made of metal of good thermal conductivity, and has a base plate 22 and a plurality of fins 21 extending upward from the base plate 22. Referring to FIG. 2, the base plate 22 of the heat sink 20 is fixed to the central processing unit 30, while the fan 10 is supported by the fins 21 of the heat sink 20. The central processing unit 30 in operation generates heat, the heat is transmitted to the heat sink 20 contacting the CPU 30, and the fan 10 generates airflow on the heat sink 20 to dissipate heat. By the arrangement, the central processing unit 30 is cooled.

A conventional heat sink has the following flaws: (1) The airflow is obstructed by the base plate 22 of heat sink 20 and therefore circulates, reducing the efficiency of heat dissipation. (2) So-called "aerodynamic noise" is increased due to the circulation of hot air. (3) The heat sink 20 is very "thick" because of a vertical extension of the fins 21, disadvantageous to mounting the heat sink in a portable computer.

SUMMARY OF THE INVENTION

An object of the present invention is to provide a heat sink that dissipates heat very well.

Another object of the present invention is to provide a heat sink that produces minimum aerodynamic noise.

Another object of the present invention is to provide a heat sink suitable for a portable computer.

The heat sink of the present invention includes a connecting board, a plurality of blades, a frame and at least one reinforcing rib. The connecting board is enclosed by the frame. The blades radiate from the connecting board to the frame. Furthermore, the blades are disposed in layers and spaced apart, thereby allowing airflow to pass between the blades. Furthermore, the blades are reinforced by the reinforcing rib.

In operation, a fan blows on the heat sink of the present invention. The airflow rapidly passes through the spaced-apart blades of the heat sink to dissipate heat therefrom. Therefore, the airflow does not circulate, thereby promoting the efficiency of heat dissipation. The arrangement of the blades prevents circulation of hot air and thus minimizes aerodynamic noise. Furthermore, the heat sink of the present invention is thinner because of a horizontal extension of the blades, advantageous to mounting the heat sink in a portable computer.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENT

Figure 1:
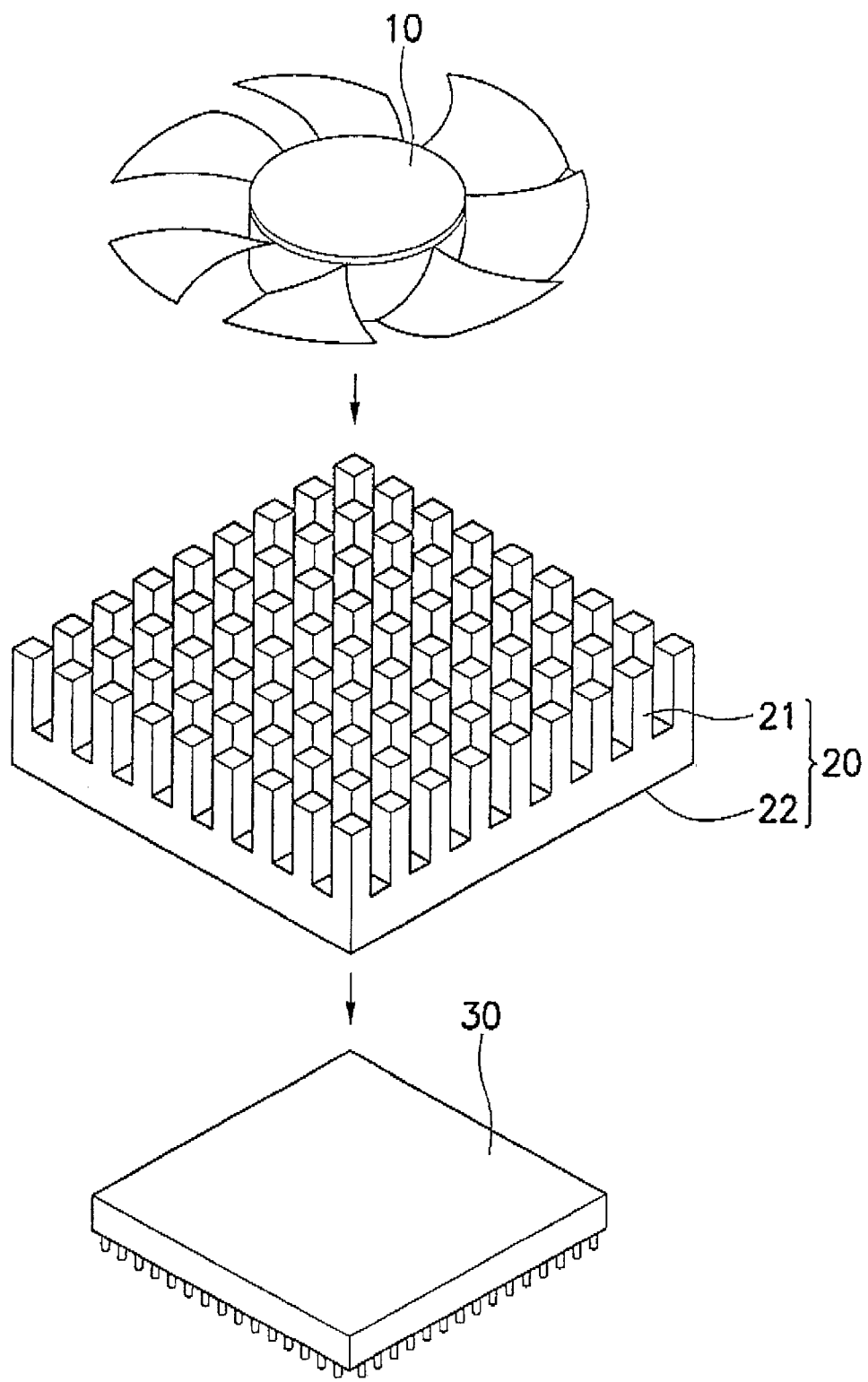
FIG. 1 depicts a fan, a conventional heat sink and a central processing unit.
Figure 2:
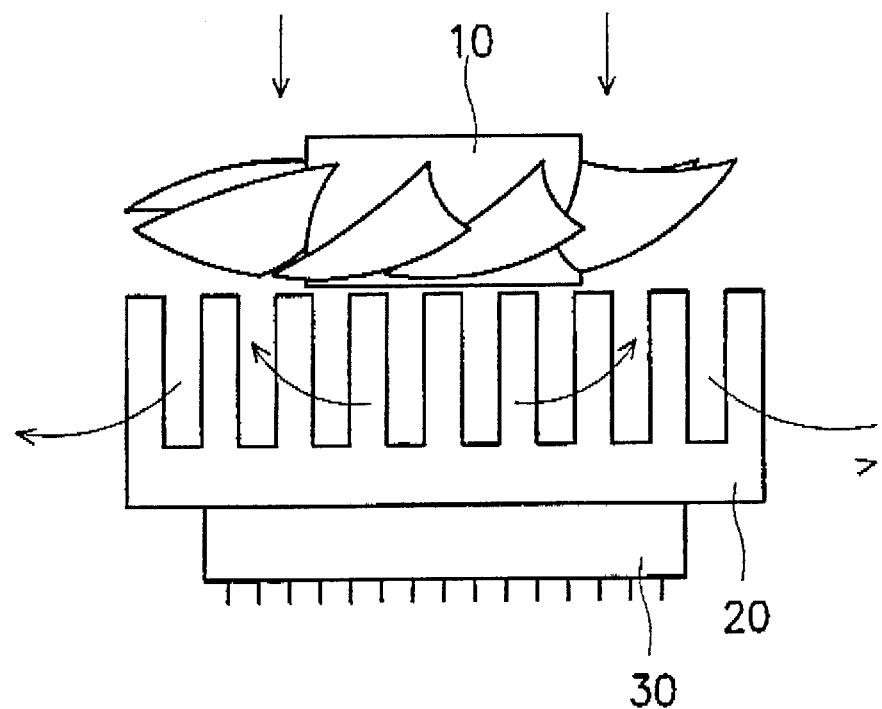
FIG. 2 depicts a cooperation of the fan, heat sink and central processing unit of FIG. 1.
Figure 3:
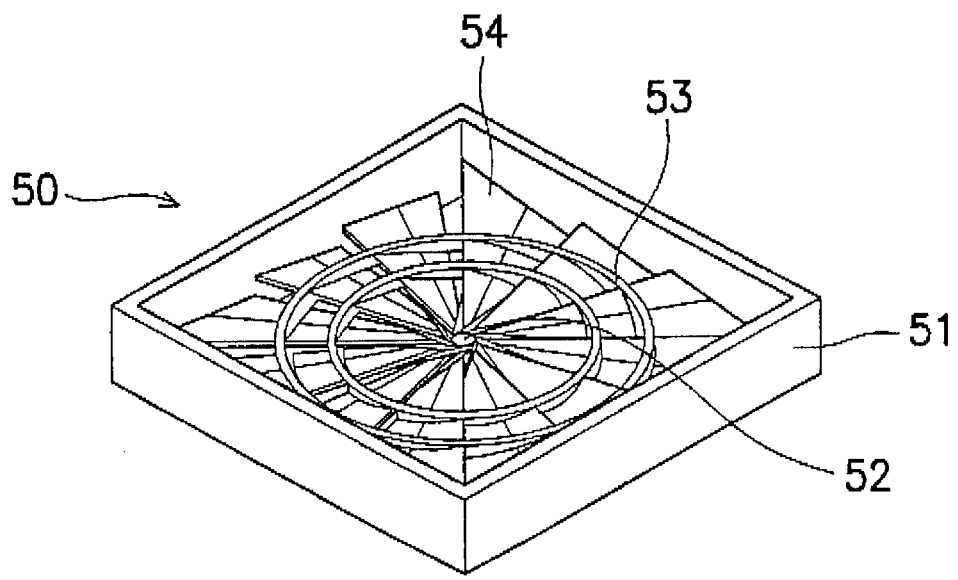
FIG. 3 is a perspective diagram of a bladed heat sink in accordance with the present invention, observed from the top thereof.
Figure 4:
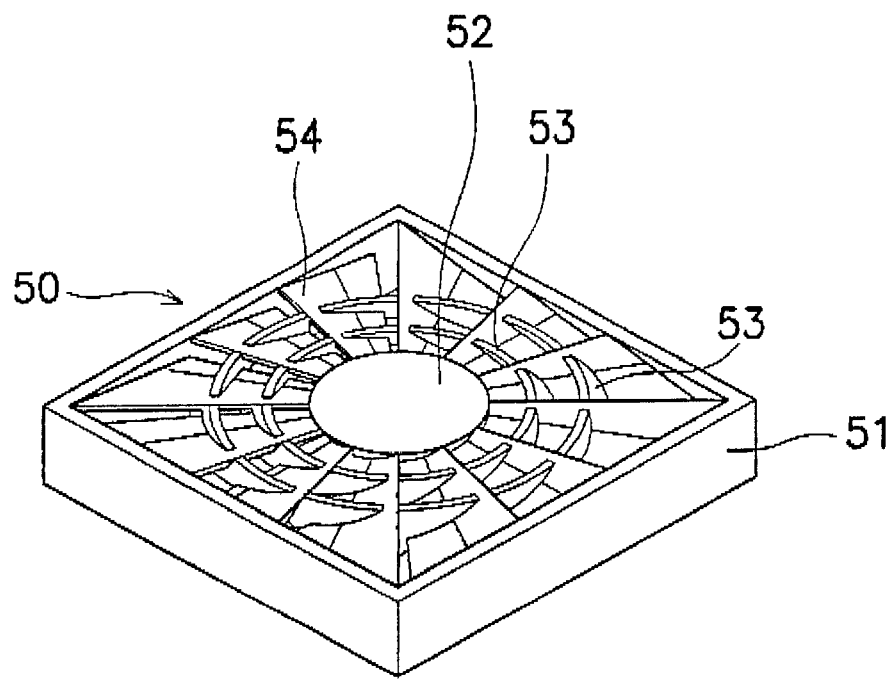
FIG. 4 is a perspective diagram of a bladed heat sink in accordance with the present invention, observed from the bottom thereof.

Referring to FIGS. 3 and 4, a heat sink 50 of the present invention has a frame 51 and a connecting board 52 enclosed by the frame 51. A plurality of flat blades 54 radiate from the connecting board 52 to the frame 51. The flat blades 54 are disposed in layers and spaced apart, thereby allowing airflow to pass between the blades. Furthermore, the blades 54 are reinforced by a plurality of circular reinforcing ribs 53.

Figure 5:
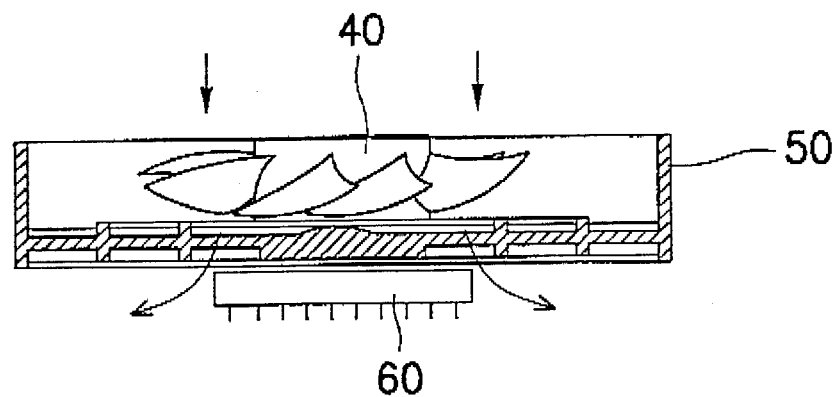
FIG. 5 depicts cooperation of a fan, a heat sink of the present invention and a central processing unit.

The heat sink 50 is made of metal of good thermal conductivity. Referring to FIG. 5, the connecting board 52 of the heat sink 50 is fixed to a central processing unit (or a hot component) 60, while a fan 40 is mounted on the heat sink 50. The central processing unit 60 in operation generates heat, the heat is transmitted to the connecting board 52 of the heat sink 20 and further to the blades 54, and the fan 40 generates airflow on the heat sink 50. The airflow passes between the blades 54 of the heat sink 50 to dissipate the heat from the heat sink 50. By the arrangement, the central processing unit 60 is cooled.

The present invention improves the flaws of the conventional heat sink in that: (1) The fan 40 blows on the heat sink 50 of the present invention. The spaced-apart blades 54 of the heat sink 50 allow the airflow to rapidly pass through. Therefore, the airflow does not circulate, thereby promoting the efficiency of heat dissipation. (2) The arrangement of the blades 54 prevents circulation of hot air and thus minimizes "aerodynamic noise". (3) The heat sink 50 of the present invention is thinner because of a horizontal extension of the blades 54, and it is advantageous to mounting the heat sink in a portable computer.

While the invention has been described by way of example and in terms of the preferred embodiment, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat sink for a hot component, comprising:
    a connecting board contacting the hot component to draw heat from the hot component;
    a plurality of blades radiating from the connecting board to draw the heat from the connecting board, the plurality of blades being disposed in layers and spaced apart, allowing airflow to pass therebetween, thereby dissipating the heat from the plurality of blades;
    at least one reinforcing rib connected between the plurality of blades; and
    a frame enclosing the plurality of blades and the connecting board.

2. A heat sink as claimed in claim 1, wherein the reinforcing rib is circular.

3. A heat sink as claimed in claim 1, wherein the plurality of blades are flat.

* * * * *